US012802746B1

(12) United States Patent
Maxted

(10) Patent No.: US 12,802,746 B1
(45) Date of Patent: Nov. 17, 2026

(54) ROW HAMMER EFFECT MITIGATION THROUGH FIRST IN FIRST OUT BUFFERING OF WRITEBACK DATA

(71) Applicant: James C. Maxted, Cedar Rapids, IA (US)

(72) Inventor: James C. Maxted, Cedar Rapids, IA (US)

( * ) Notice: Subject to any disclaimer, the term of this patent is extended or adjusted under 35 U.S.C. 154(b) by 0 days.

(21) Appl. No.: 19/419,596

(22) Filed: Dec. 15, 2025

Related U.S. Application Data

(60) Provisional application No. 63/904,984, filed on Oct. 24, 2025.

(51) Int. Cl.
*G11C 11/4093* (2006.01)
*G11C 11/4076* (2006.01)
*G11C 11/4091* (2006.01)
*G11C 11/4096* (2006.01)

(52) U.S. Cl.
CPC ...... *G11C 11/4093* (2013.01); *G11C 11/4076* (2013.01); *G11C 11/4091* (2013.01); *G11C 11/4096* (2013.01)

(58) Field of Classification Search
USPC .......................... 365/189.05, 189.08, 230.08
See application file for complete search history.

(56) References Cited

U.S. PATENT DOCUMENTS 9,236,110 B2 1/2016 Bains
9,299,400 B2 3/2016 Bains
9,812,185 B2 11/2017 Fisch
9,934,143 B2 4/2018 Bains
10,108,365 B1 10/2018 Bittlestone
10,528,736 B1 1/2020 Sobel et al.
10,790,005 B1 9/2020 He
10,950,292 B1 3/2021 Seyedmohammad et al.
11,037,618 B2 6/2021 Eojin et al.
11,354,408 B2 6/2022 Ghosh et al.
11,488,654 B2 11/2022 Seyedzadehdelcheh
11,527,280 B2 12/2022 Bennett et al.
11,640,840 B2 5/2023 Seyedmohammad et al.
11,887,686 B2 1/2024 Jin et al.
12,002,502 B2 6/2024 Hong
12,026,387 B2 7/2024 Seyedzadehdelcheh et al.
12,027,199 B2 7/2024 You et al.
12,032,692 B2 7/2024 Le Rolland et al.
12,067,270 B2 * 8/2024 Lu ....................... G11C 11/4078
12,094,515 B2 9/2024 Van Der Veen et al.
12,105,971 B2 10/2024 Del Gatto et al.
12,131,071 B2 10/2024 Majumdar et al.
12,175,087 B2 12/2024 Seyedzadehdelcheh et al.
(Continued)

FOREIGN PATENT DOCUMENTS

CN 119418750 A 2/2025
CN 121148442 A 12/2025
(Continued)

*Primary Examiner* — Connie C Yoha
(74) *Attorney, Agent, or Firm* — SHUTTLEWORTH & INGERSOLL, PLC; Jason R. Sytsma

(57) ABSTRACT

A row data buffer structure to buffer row data from multiple row read operations and to delay writeback of buffered row data to the cell array by writing back data from an oldest register only when adding new row data would exceed capacity of the row data buffer structure, thereby mitigating row hammer effects through temporal spacing of row activations.

19 Claims, 6 Drawing Sheets

(56) References Cited

U.S. PATENT DOCUMENTS

| | | | |
|---|---|---|---|
| 12,189,764 B2 | | 1/2025 | Agarwal et al. |
| 12,211,543 B2 | | 1/2025 | Van Der Veen et al. |
| 12,217,824 B2 | | 2/2025 | Gieske et al. |
| 12,236,105 B2 | * | 2/2025 | Cho .................. G11C 11/40622 |
| 12,236,996 B2 | | 2/2025 | Lee et al. |
| 12,242,388 B2 | | 3/2025 | Akel et al. |
| 12,254,203 B2 | | 3/2025 | Deutsch et al. |
| 12,308,069 B2 | | 5/2025 | Van Der Veen et al. |
| 12,347,477 B2 | | 7/2025 | Lee et al. |
| 12,354,640 B2 | | 7/2025 | Kim et al. |
| 12,394,466 B2 | | 8/2025 | Kim et al. |
| 12,394,468 B2 | | 8/2025 | Gieske et al. |
| 12,412,614 B2 | | 9/2025 | Confalonieri et al. |
| 12,412,615 B2 | | 9/2025 | Ahn et al. |
| 12,431,182 B2 | | 9/2025 | Vogelsang et al. |
| 12,443,367 B2 | | 10/2025 | Nale et al. |
| 12,456,509 B2 | | 10/2025 | Kim et al. |
| 12,700,445 B2 | * | 8/2026 | Oh .................... G11C 11/40618 |
| 2017/0117030 A1 | * | 4/2017 | Fisch .................. G11C 11/4078 |
| 2020/0042451 A1 | | 2/2020 | Karmakar |
| 2021/0089455 A1 | | 3/2021 | Berger |
| 2022/0188238 A1 | | 6/2022 | Su |
| 2023/0072394 A1 | | 3/2023 | Haywood |
| 2023/0205872 A1 | | 6/2023 | Kotra |
| 2023/0236968 A1 | | 7/2023 | Gieske |
| 2025/0156351 A1 | | 5/2025 | Sancon |

FOREIGN PATENT DOCUMENTS

| | | |
|---|---|---|
| JP | 2002334580 A | 11/2002 |
| TW | 202411995 A | 3/2024 |

* cited by examiner

ROW HAMMER EFFECT MITIGATION THROUGH FIRST IN FIRST OUT BUFFERING OF WRITEBACK DATA

PRIORITY

This non-provisional application claims priority to U.S. Provisional Patent Application No. 63/904,984 filed on Oct. 24, 2025, the entirety of which is hereby incorporated by reference herein.

TECHNICAL FIELD

The present invention relates generally to the field of semiconductor memory devices and, more particularly, to memory devices and methods for mitigating the Row Hammer Effect through delayed writeback of row data using a multi-entry buffer structure integrating content addressable memory (CAM) and first-in-first-out (FIFO) functionality.

BACKGROUND

Dynamic Random Access Memory (DRAM) is a type of semiconductor memory widely used in computing devices for storing data. In standard DRAM operations, data is stored as electrical charges in capacitors arranged in a two-dimensional array of rows and columns. To access data, a row is activated by selecting its word line, which transfers the charge from the capacitors in that row to sense amplifiers. This read process is destructive, meaning the original charge in the capacitors is depleted. Consequently, the data held in the sense amplifiers must be written back to the original row to restore the stored information. Write operations similarly involve reading the row into sense amplifiers, modifying the relevant data, and writing back the updated row. Additionally, DRAM requires periodic refresh operations to maintain data integrity, as charges in the capacitors naturally leak over time.

A known vulnerability in DRAM is the Row Hammer Effect, which can lead to data corruption. This effect occurs when a specific row (the "aggressor row") is repeatedly activated and deactivated in rapid succession, causing accelerated charge leakage from the capacitors in that row. This leakage can induce voltage fluctuations that inadvertently flip bits in adjacent rows (the "victim rows"), resulting in erroneous data without direct access to those rows. Such disturbances are particularly problematic in high-density DRAM arrays where rows are physically close together. The Row Hammer Effect has been exploited in security attacks to compromise system integrity, such as escalating privileges or extracting sensitive information. Existing approaches to mitigate this issue include techniques like targeted row refresh (TRR), where adjacent rows are preemptively refreshed, or probabilistic activation counting, but these methods may introduce performance overhead, increased power consumption, or require additional hardware complexity.

The present invention addresses these challenges by providing an improved mechanism for mitigating the Row Hammer Effect in memory systems.

SUMMARY

Disclosed is a memory device comprising a cell array comprising a plurality of rows for storing data, sense amplifiers configured to read data from a selected row of the cell array, and a row data buffer structure operatively coupled to the sense amplifiers and the cell array. The row data buffer structure comprises of a plurality of registers, each register configured to store a row address and corresponding row data read from the cell array, content addressable memory (CAM) configured to compare a current row address with row addresses stored in the plurality of registers to determine if the corresponding row data is buffered, and a first-in-first-out (FIFO) logic configured to shift contents of the registers and manage storage of new row addresses and row data. The row data buffer structure is configured to buffer row data from multiple row read operations and to delay writeback of buffered row data to the cell array by writing back data from an oldest register only when adding new row data would exceed capacity of the row data buffer structure, thereby mitigating row hammer effects through temporal spacing of row activations.

In an embodiment, the FIFO logic is configured to store a new row address and corresponding row data in an available register of the plurality of registers when the row data buffer structure is not full, and shift contents of the registers toward an output register after writing back data from the output register to the cell array when adding new row data would exceed the capacity, wherein the output register holds the oldest buffered row data. The row data buffer structure can be further configured to upon determining a match via the CAM for the current row address during a read or write operation, access or modify the corresponding row data in the matched register without shifting the contents of the registers and without writing back the modified row data to the cell array until the row data reaches the oldest register.

In an embodiment, upon writing back data from the oldest register to the cell array, the row data buffer structure is further configured to route the row address stored in the oldest register to a row address decoder of the cell array to select the corresponding row, and activate row storage drivers to write the row data from the oldest register back to the selected row in the cell array before shifting the contents of the registers.

In an embodiment, a number of the plurality of registers in the row data buffer structure is determined based on an analysis of characteristics of the cell array to achieve a desired delay between writebacks to a same row in the cell array. The row data buffer structure can further comprise inputs configured to receive row data from the sense amplifiers, the current row address for comparison by the CAM, and modified row data from input/output (I/O) logic. During a write operation to a buffered row, the modified row data from the I/O logic is written back to the matched register in the row data buffer structure without immediate writeback to the cell array.

In an embodiment, the row data buffer structure further comprises outputs configured to provide read data from a matched register to output drivers coupled to memory interface circuits, and to provide row write data and the corresponding row address from the oldest register to row storage drivers and a row address decoder of the cell array during writeback.

In an embodiment, the row data buffer structure is initialized in an empty state with no row addresses or row data stored in the plurality of registers, and wherein, upon an initial row read operation where the current row address does not match any stored row addresses via the CAM, the current row address and corresponding row data from the sense amplifiers are stored in a oldest register of the plurality of registers. The row data buffer structure can be configured to provide buffered row data from a matched register to column select logic for read operations via memory interface circuits, and receive updated row data from the column select logic for write operations, wherein the updated row data is stored back in the matched register without immediate writeback to the cell array.

In another embodiment, a method for mitigating row hammer effects in a memory device having a cell array comprising a plurality of rows for storing data and sense amplifiers configured to read data from a selected row of the cell array is provided. The method comprises providing a row data buffer structure operatively coupled to the sense amplifiers and the cell array, the row data buffer structure comprising, a plurality of registers, each register configured to store a row address and corresponding row data read from the cell array, content addressable memory (CAM) configured to compare a current row address with row addresses stored in the plurality of registers to determine if the corresponding row data is buffered, and first-in-first-out (FIFO) logic configured to shift contents of the registers and manage storage of new row addresses and row data. The method further provides for buffering, using the row data buffer structure, row data from multiple row read operations, and delaying writeback of buffered row data to the cell array by writing back data from an oldest register only when adding new row data would exceed capacity of the row data buffer structure, thereby mitigating row hammer effects through temporal spacing of row activations.

In an embodiment, the FIFO logic performs storing a new row address and corresponding row data in an oldest empty register of the plurality of registers when the row data buffer structure is not full, and shifting contents of the registers downward toward the oldest register after writing back data from the oldest register to the cell array when adding new row data would exceed the capacity. In an embodiment, the method upon determining a match via the CAM for the current row address during a read or write operation, comprises accessing or modifying the corresponding row data in the matched register without shifting the contents of the registers and without writing back the modified row data to the cell array until the row data reaches the oldest register. Upon writing back data from the oldest register to the cell array, the method further comprises routing the row address stored in the oldest register to a row address decoder of the cell array to select the corresponding row, and activating row storage drivers to write the row data from the oldest register back to the selected row in the cell array before shifting the contents of the registers.

In an embodiment, a number of the plurality of registers in the row data buffer structure is determined based on an analysis of characteristics of the cell array to achieve a desired delay between writebacks to a same row in the cell array. The method can further comprise receiving, at inputs of the row data buffer structure, row data from the sense amplifiers, the current row address for comparison by the CAM, and modified row data from input/output (I/O) logic; and during a write operation to a buffered row, writing back the modified row data from the I/O logic to the matched register in the row data buffer structure without immediate writeback to the cell array. The method can include providing, from outputs of the row data buffer structure, read data from a matched register to output drivers coupled to memory interface circuits, and providing row write data and the corresponding row address from the oldest register to row storage drivers and a row address decoder of the cell array during writeback.

In an embodiment, the method further comprises of initializing the row data buffer structure in an empty state with no row addresses or row data stored in the plurality of registers; and upon an initial row read operation where the current row address does not match any stored row addresses via the CAM, storing the current row address and corresponding row data from the sense amplifiers in an oldest register of the plurality of registers. In other embodiments, the method can include providing buffered row data from a matched register to column select logic for read operations via memory interface circuits; and receiving updated row data from the column select logic for write operations, wherein the updated row data is stored back in the matched register without immediate writeback to the cell array. The method can also include during a row read operation comparing the current row address with row addresses stored in the plurality of registers using the CAM; upon determining no match via the CAM, storing the row data in the row data buffer structure as active row data; and upon determining a match via the CAM, ignoring the row data in the cell array and using the row data from the matched register as the active row data without modifying contents of the row data buffer structure.

BRIEF DESCRIPTION OF THE DRAWINGS

These and other features and advantages of the present invention will be better understood by reading the following detailed description, taken together with the drawings wherein.

DETAILED DESCRIPTION

Figure 1:
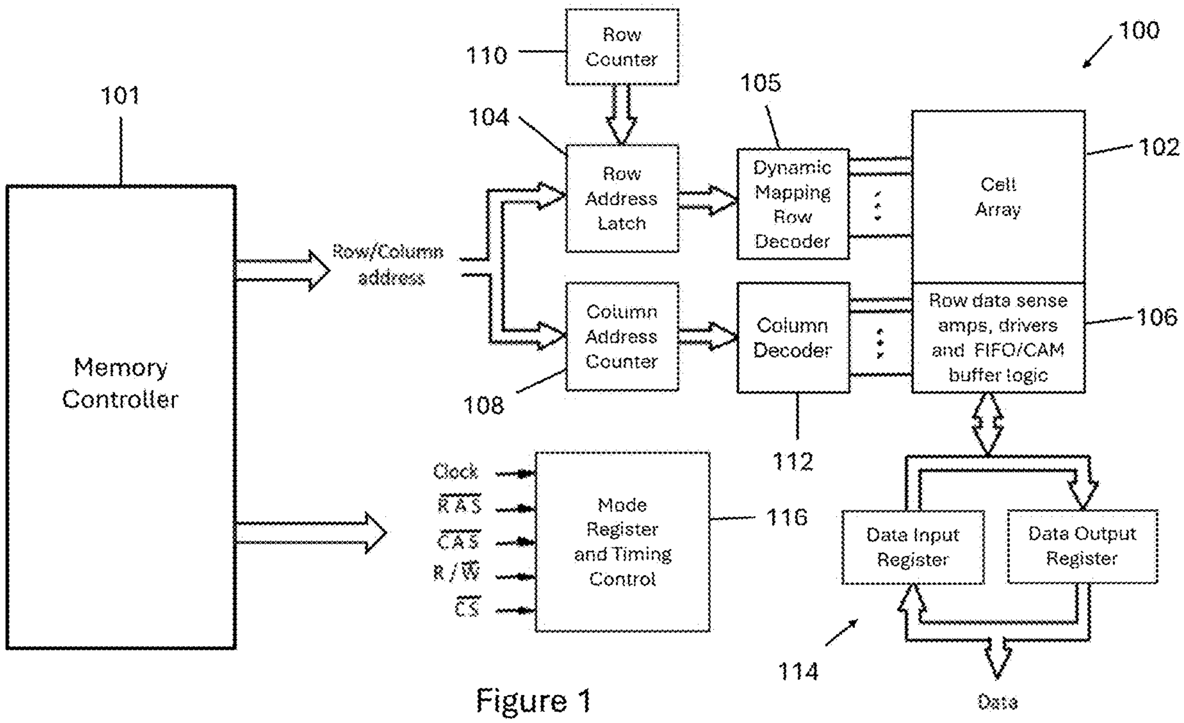
FIG. 1 is a block diagram of the DRAM system according to this disclosure.

FIG. 1 shows the functional blocks of a memory device 100 according to this disclosure. Data is stored in a cell array 102 in the form of rows of charged and discharged switched capacitors. When data is read from cell array 102, a row select line is activated. The state of every bit cell capacitor C in the row is then sensed by a sense amplifier 104, and the resulting detected bit value is captured in a data register 106 for row data buffering. This action is destructive; any bit capacitor that is charged will be discharged by reading the row values. Once the row data has been stored in data register 106, the specific location information as determined by the column address is then passed to the SDRAM data signals for a READ operation. For a WRITE operation, the input data modifies the selected information within data register 106. In both cases, the information from data register 106 is then written back to the cell array 102 by activating the proper row select line.

Data register 106 combined to sense amplifiers 104 mitigates row hammering by introducing a delay between the READ and WRITE operations with a row data buffer structure that replaces the conventional data buffer with an intermediary multi-row, data register 106 for handling row data during read and write operations. Data register 106 structure comprises a plurality of registers, each register configured to store a row address and corresponding row data read from the cell array 102. The registers are storage elements within the structure, organized in a stacked configuration (e.g., registers 1 through 4 in the examples), where each holds both the row address (for identification) and the full row data (e.g., thousands of bits depending on row width).

Data register 106 contains a content addressable memory (CAM) configuration to compare a current row address selected for a READ operation with row addresses stored in data register 106 to determine if the corresponding row data is already buffered. The CAM is a specialized memory that can perform sequential or parallel searches on the stored row addresses in data register 106, enabling rapid matching to check for hits (presence) or misses (absence) without sequential scanning. Whenever any row is read, data register 106 is checked to see if the row data is already stored in data register 106. If there is no match, the row data is read from the active row in cell array 104 and the data is stored in data register 106. If the data is already stored in data register 106, then cell array 104 does not contain the active row data and therefore nothing is changed in data register 106. In either case, the active row data is also passed on to the column select and output logic. This action can be done sequentially with data register 106 checked before cell array 104. If the row data is contained in data register 106, the data from the cell array 104 is of no consequence since the real row data was previously stored in data register 106.

The row data buffer structure stored in data register 106 further comprises first-in-first-out (FIFO) logic configured to shift contents of the registers in data register 106 and manage storage of new row addresses and row data. The FIFO logic implements a queue-like behavior, where data enters at one end and exits at the other, handling shifts (e.g., downward in the examples) to maintain order and manage buffer capacity. The FIFO logic ensures that writeback of the oldest row data (from the lowest data register 104) to cell array 102 occurs immediately after a row read operation that fills data register 104 to capacity, followed by shifting the contents downward to accommodate new entries. This cell array 102 writeback is independent of memory write operations at the chip level, which update specific locations in buffered row data via column select logic without triggering immediate writeback; for instance, when the buffer in data register 104 is nearly full and a write to a new row fills it, the new row's data is updated as stored while simultaneously initiating writeback of the bottom row of data register 104.

The row data buffer structure stored in data register 106 is configured to buffer row data from multiple row read operations and to delay writeback of buffered row data to the cell array 102 by writing back data from a lowest register in data register 106 only when adding new row data would exceed capacity of the row data buffer structure, thereby mitigating row hammer effects through temporal spacing of row activations. In operation, the structure holds data from several rows (e.g., up to the number of registers), performing reads and writes on buffered data without immediate array writeback. Writeback occurs only for the lowest register's data when data register 106 is full and a new row is added, introducing a delay based on buffer depth. This delay prevents rapid repeated activations of the same row, reducing charge leakage to adjacent rows that could corrupt data.

FIGS. 2A-2G illustrate the general organization and operation of a simplified, four row data buffer structure. As shown, data register 106 includes a plurality of registers (four registers in this exemplary embodiment, labeled Register 1 at the top to Register 4 at the bottom), each capable of storing a row address and corresponding row data. The number of registers is determined based on an analysis of the characteristics of cell array 102 to achieve a desired temporal delay between writebacks to the same row, thereby spacing out row activations sufficiently to prevent charge leakage impacts on adjacent rows. A typical cell array 102 may contain multiple banks each with tens of thousands or more rows meaning a data register 106 may hundreds or thousands of rows.

The inputs to the data register 106 include: (1) the current row address from an input source (e.g., a row address latch or multiplexer); (2) row data from sense amplifiers 104 following a destructive READ from the cell array 102; and (3) modified row data from input/output (I/O) logic during WRITE operations. These inputs are coupled with memory controller 102 to enable content addressable memory (CAM) comparisons and data storage. The CAM functionality allows data register 106 to compare the current row address against stored row addresses in data register 106 to detect matches (hits) for buffered rows.

Figure 2A:
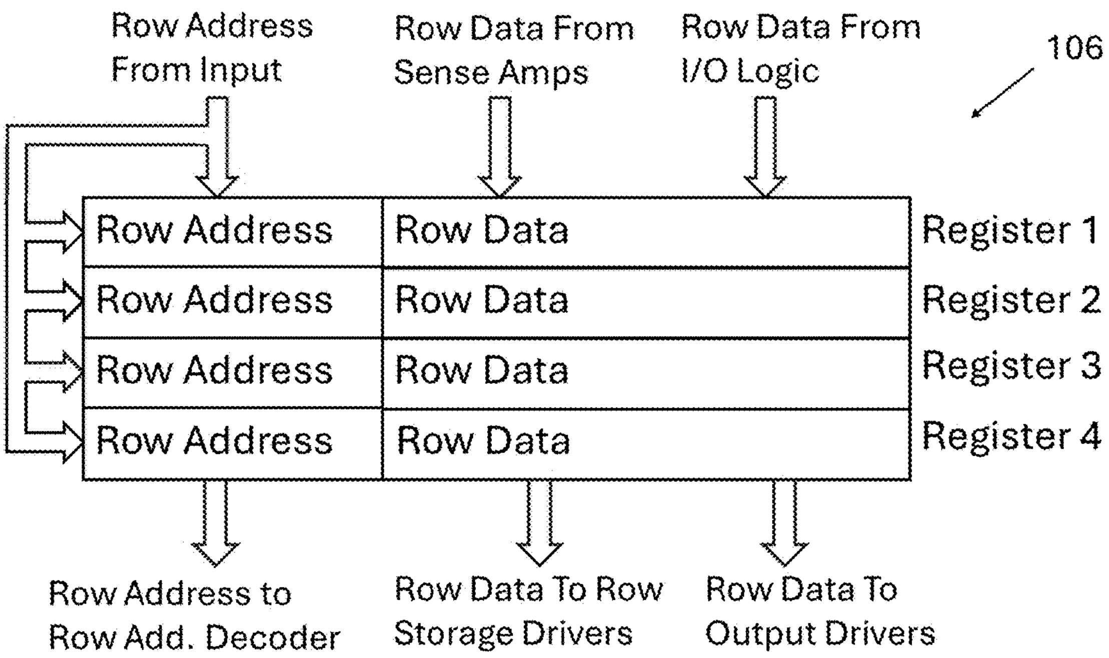
FIG. 2A is a first step in an exemplary row data buffer structure according to this disclosure.

The outputs from data register 106 include: (1) the row address from the lowest register (Register 4) routed to a row address decoder 105 (see FIG. 1) for selecting the corresponding row in the cell array during writeback; (2) row data to output drivers for providing read data to memory interface circuits; and (3) row data from the lowest register to row storage drivers for writing back to cell array 102. The structure operates as a combination of FIFO and CAM, where new row data is buffered in available registers of data register 106, accesses or modifications occur in-place on hits, and writebacks are delayed until the buffer is full, at which point the oldest data (from the lowest register) is written back before shifting contents downward. Initially, as shown in FIG. 2A, the row data buffer structure is empty, with no row addresses or data stored in any registers.

Figure 2B:
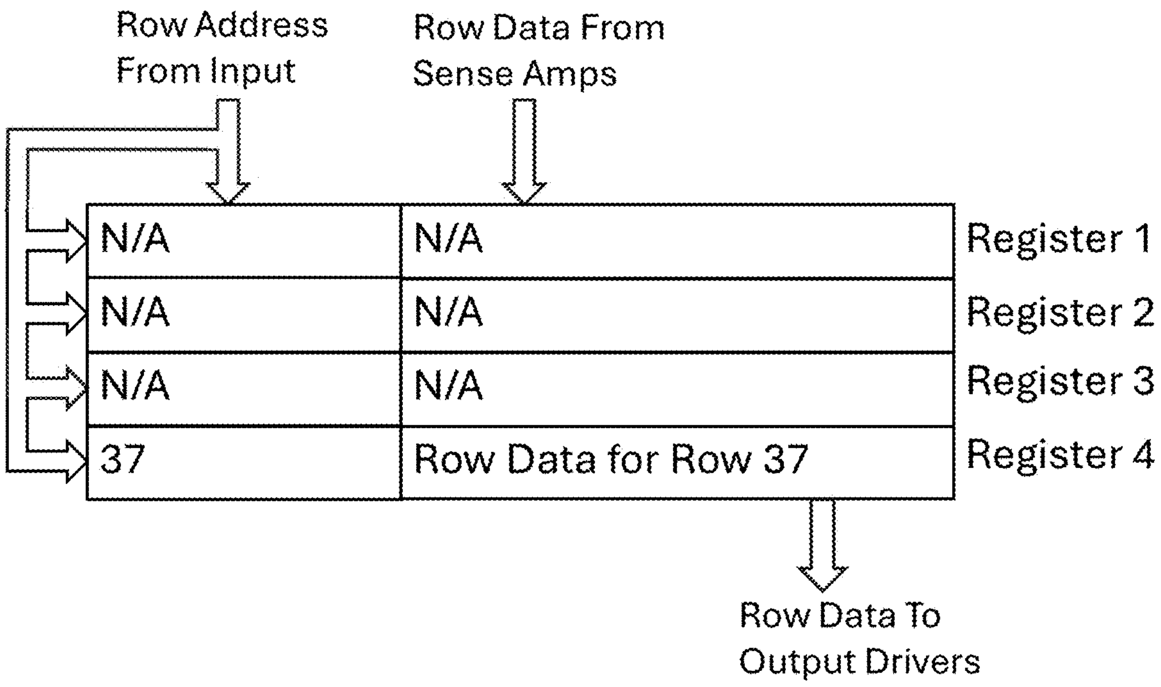
FIG. 2B is a second step in an exemplary row data buffer structure according to this disclosure.

FIG. 2B depicts the state of the row data buffer structure after performing a READ operation on row 37 of cell array 102. Upon initiating the READ operation, the row 37 select line is activated, and the row data is read destructively from cell array 102 into sense amplifiers 104. The current row address (37) is presented to the CAM interface of the row data buffer structure. If a match is found, the data from sense amplifiers 104 is ignored, as it may represent stale information not yet updated from prior modifications in data register 106, and the buffered row data is used instead. No changes are made to the buffer contents. Since the structure is initially empty, no match is found. Accordingly, row address 37 and the corresponding row data from the sense amplifiers 104 are stored in the oldest empty register, which is Register 4 (the bottom, lowest register in the diagram), which would make it the "first in" in the FIFO organization. Note that new data is always added to the lowest-numbered available register in the "empty" portion of the stack, but in this filling sequence, it begins from the conceptual "bottom" upward as the buffer populates with the bottom being the oldest, the second lowest register being the second oldest, etc.

If the memory operation is a READ from a location within row 37, the CAM match with Register 4 makes the row 37 data available to the column select logic for output via memory controller 102. For a WRITE operation to a location within row 37, the row data in Register 4 would be modified by the column select logic using input from the I/O logic and then stored back into Register 4. Importantly, at this stage, no data is written back to the cell array 102, as the data register 106 is not full. This delay in writeback begins the temporal spacing that mitigates rapid activations associated with the Row Hammer Effect.

Figure 2C:
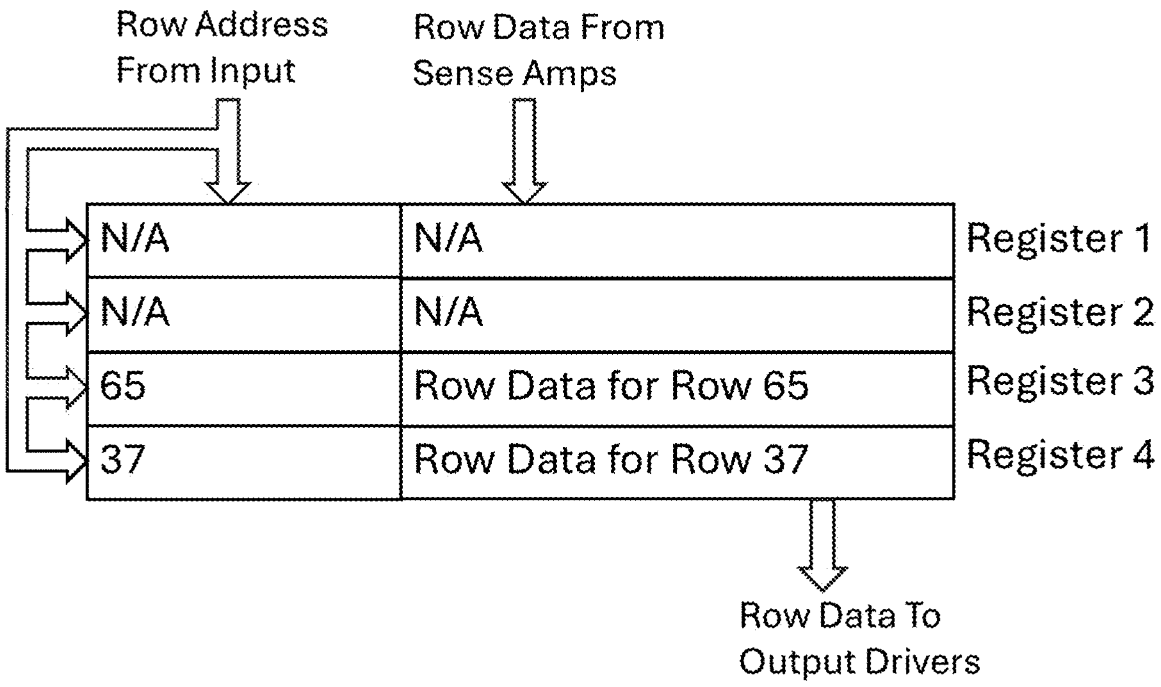
FIG. 2C is a third step in an exemplary row data buffer structure according to this disclosure.

FIG. 2C shows the contents of the row data buffer structure after a subsequent memory operation that involves reading row 65 from cell array 102. The row address 65 is presented to the CAM inputs, and since no match is found (row 65 data is not yet buffered), the current contents are effectively positioned to accommodate the new entry: the row address 65 and corresponding row data from sense amplifiers 104 are stored in the next oldest empty register, which is Register 3. The prior entry (row 37 in Register 4) remains in place. Again, no writeback to the cell array occurs, data register 106 still has available capacity. This continues the buffering process, allowing multiple rows to be held without immediate restoration to the array.

Figure 2D:
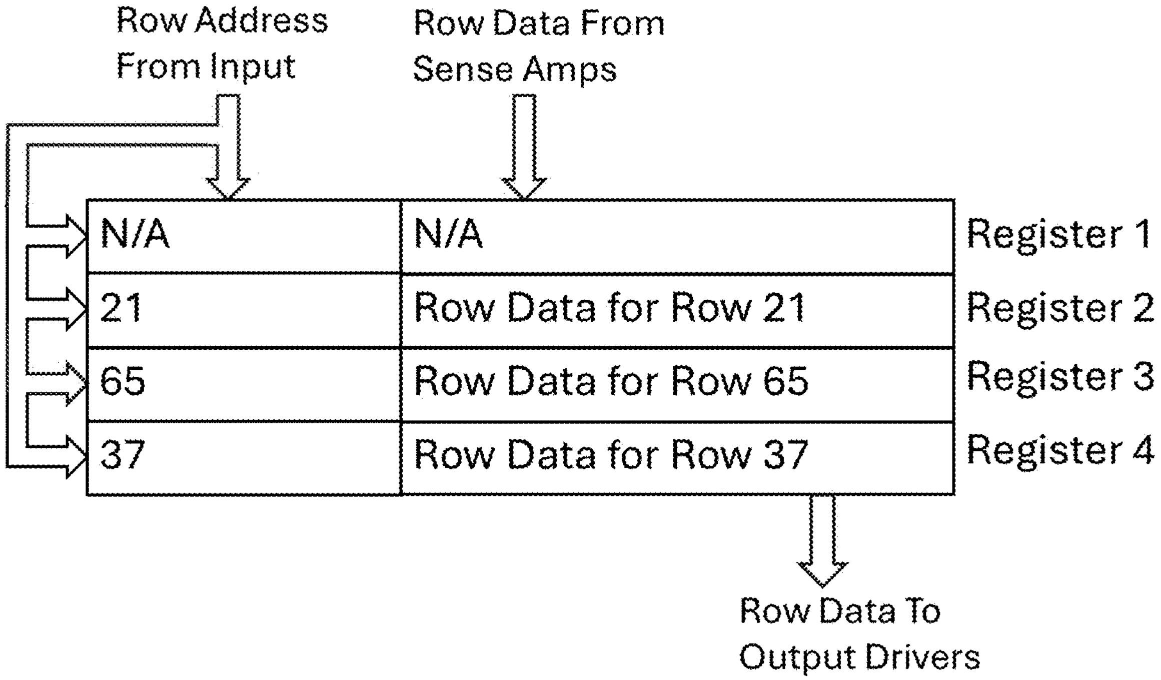
FIG. 2D is a fourth step in an exemplary row data buffer structure according to this disclosure.

The example proceeds in FIG. 2D with the reading of row 21 from the cell array 102. Similarly, the row address 21 is compared via the CAM in data register 106, no match is detected, and the row address 21 along with its row data are stored in the next oldest empty register, Register 2. Data register 106 now holds row 21 in Register 2, row 65 in Register 3, and row 37 in Register 4, with Register 1 remaining empty. No writeback is performed, further delaying the restoration of any buffered row data to the array.

Figure 2E:
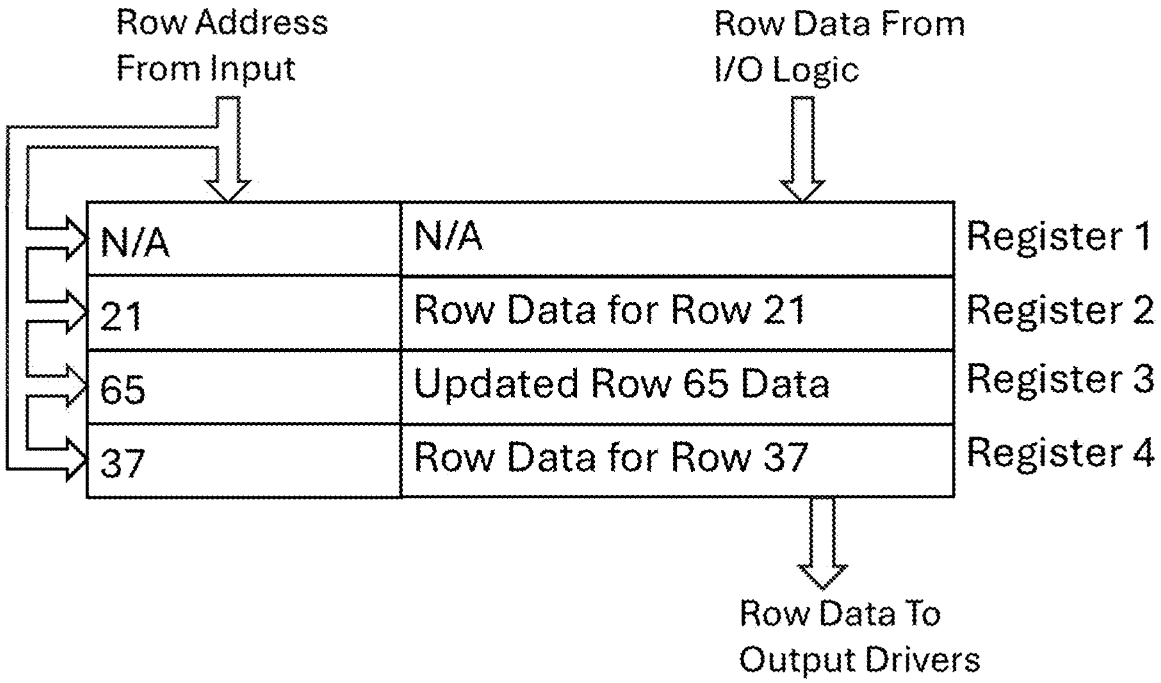
FIG. 2E is a fifth step in an exemplary row data buffer structure according to this disclosure.

FIG. 2E illustrates the row data buffer structure after a WRITE operation to data contained within row 65. The row address 65 is presented to the CAM inputs, resulting in a match with the entry in Register 3. The row 65 data is retrieved from Register 3, updated by the I/O logic and column select logic to reflect the new WRITE data, and then stored back into Register 3 without shifting any contents or performing a writeback to the cell array. The structure remains as: row 21 in Register 2, updated row 65 in Register 3, and row 37 in Register 4, with Register 1 empty. This in-place modification exemplifies how the CAM enables efficient access to buffered rows without triggering unnecessary cell array 102 interactions, enhancing performance while maintaining the delay mechanism.

Figure 2F:
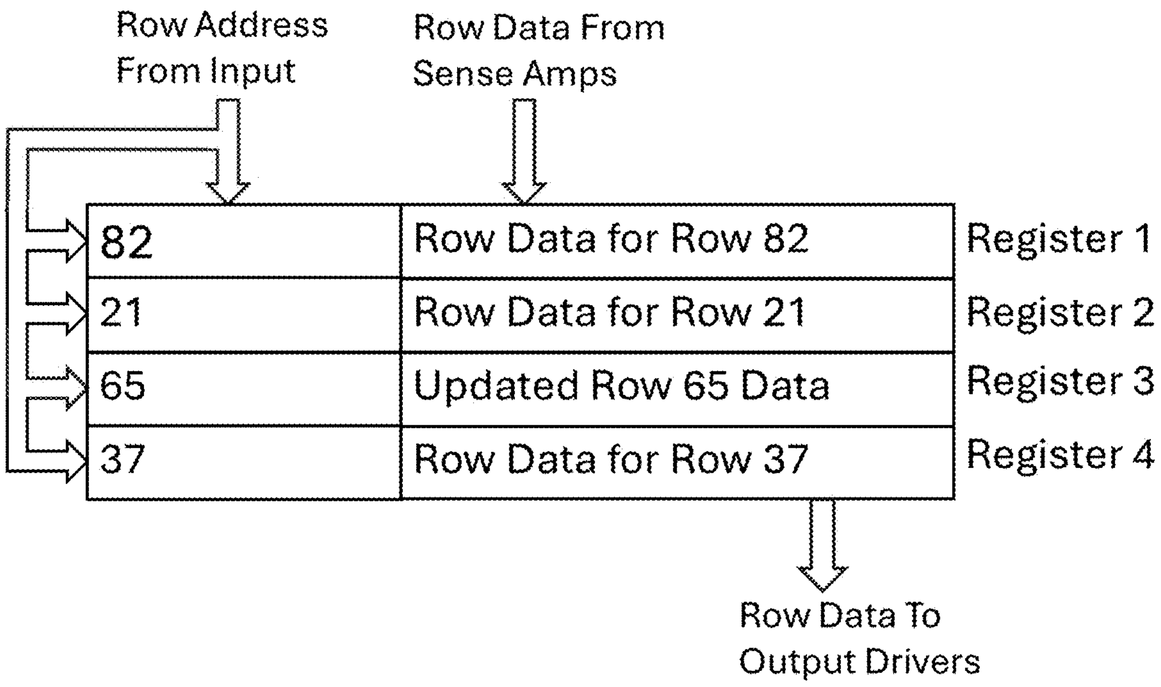
FIG. 2F is a sixth step in an exemplary row data buffer structure according to this disclosure.

FIG. 2F presents the state of the row data buffer structure after reading row 82 from the cell array 102. The row address 82 is compared via the CAM, no match is found, and since the buffer is not yet full (Register 1 is empty), the row address 82 and its row data are stored in Register 1. The structure is now full: row 82 in Register 1, row 21 in Register 2, updated row 65 in Register 3, and row 37 in Register 4. Still, no immediate writeback occurs until a new operation requires adding another entry.

At this point, since the data register 106 is full, the next operation that requires adding new row data (not shown in the figures) would trigger a writeback of the oldest buffered row per FIFO. Specifically, the row data in the lowest, oldest register (Register 4, containing row 37) is written back to the cell array 102: the row address 37 from Register 4 is routed to row address decoder 105 to select row 37, and the row storage drivers are activated to restore the data to cell array 102.

Figure 2G:
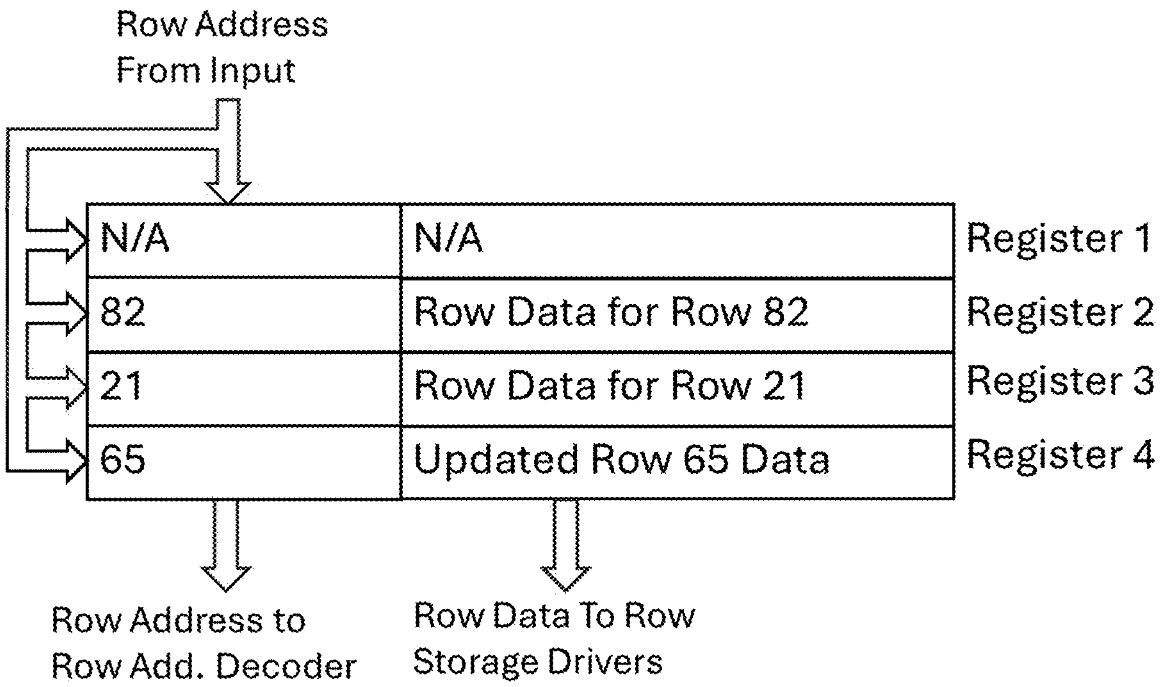
FIG. 2G is a seventh step in an exemplary row data buffer structure according to this disclosure.

FIG. 2G depicts the row data buffer structure after the writeback of row 37 data and the subsequent shifting of contents. Following the writeback, the FIFO logic shifts the remaining contents downward: the data from Register 1 (row 82) moves to Register 2, Register 2 (row 21) to Register 3, and Register 3 (updated row 65) to Register 4, leaving Register 1 empty. This prepares data register 106 for the next row READ or WRITE operation. The shift ensures that the oldest remaining data progresses toward the lowest register for eventual writeback.

Through this sequence illustrated in FIGS. 2A-2G, the row data buffer structure mitigates the Row Hammer Effect by delaying writebacks to any given row in the cell array 102 by a duration proportional to the number of registers in data register 106. An analysis of the cell array's 102 leakage characteristics and activation thresholds determines the optimal number of registers to ensure sufficient temporal spacing, preventing corruption in adjacent rows without the overhead of traditional mitigation techniques like targeted refreshes or activation counters.

Returning to FIG. 1, external row and column addresses are multiplexed and directed to dedicated processing elements. The row address is captured by a row address latch 107, which stabilizes the signal for subsequent decoding, while the column address is fed into a column address counter 108 capable of sequential incrementation to facilitate burst-mode accesses across multiple columns within an activated row. To manage refresh requirements, a dedicated refresh row counter 110 autonomously generates row addresses, injecting them into the row address latch 107 during designated cycles to systematically recharge entire rows without interrupting primary data operations.

These latched and counted addresses are then routed to respective decoders for translation into physical selection signals. A row address decoder 105, driven by row address latch 107 (or refresh counter as applicable), activates a specific word line within the cell array, thereby opening the access transistors along that row and coupling the capacitors' stored charges onto complementary bit lines. Row address decoder 105 may be implemented as a dynamic mapping row decoder expressed in co-pending patent application titled, *Dynamic Row Address Mapping for Mitigating Row Hammer Effect in DRAM*, filed by the instant inventor on Nov. 7, 2025 as application Ser. No. 19/382,665, the entire contents of which are hereby incorporated by reference herein. This row activation phase exposes the contents of the selected row for sensing. Concurrently, the column decoder 112, informed by the column address counter 108, isolates specific bit line pairs from the activated row, directing them toward peripheral circuitry for data extraction or modification.

The selected bit lines interface with read/write circuits and data register 106, which serve as the interface between the core cell array 102 and external data paths. The outputs of data register 106 connect to data input and output registers 114, which buffer incoming write data from the system bus and stage read data for delivery, thereby accommodating timing mismatches between the SDRAM core and the host processor.

Overseeing the timing of these processes is a mode register and timing control circuit 116, synchronized to an external clock signal. The mode register configures operational parameters, such as burst length or power management modes, while the timing control circuit enforces precise sequencing of activation, sensing, and precharge phases across multiple clock cycles. This clock-driven framework ensures orderly progression through the multi-step access cycle to preserve signal integrity. Memory controller 102 coordinates with the mode register and timing control circuit 116 to manage overall SDRAM operations, including initiating row activations, CAM comparisons, and FIFO shifts within the data register 106; specifically, memory controller 102 interfaces to the mode register and timing control circuit 116, which then interacts with the row data buffer structure in data register 106 to ensure precise sequencing of buffering, modifications, and delayed writebacks while maintaining system synchronization and data integrity.

Figure 3A:
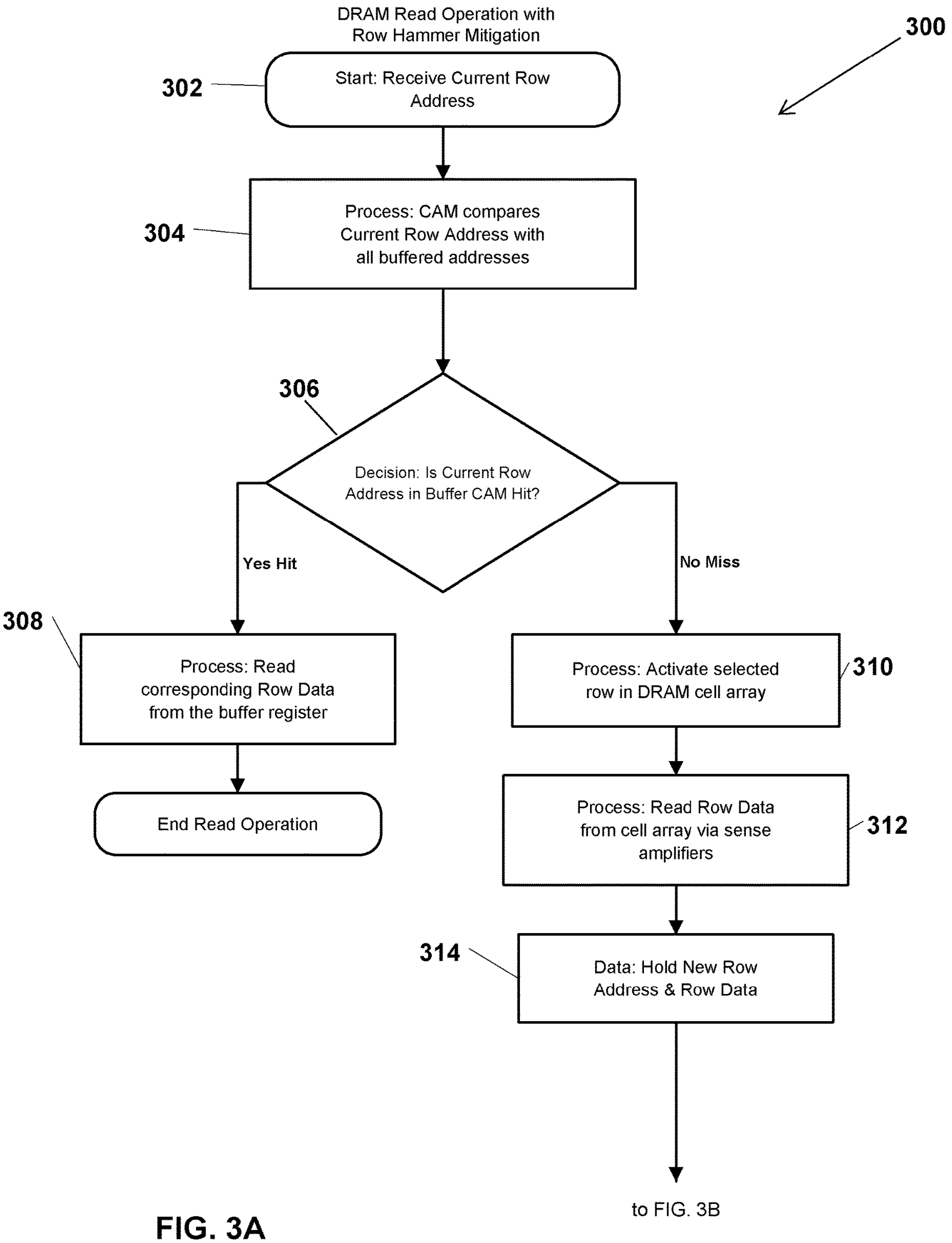
FIG. 3A is a flow chart illustrating a method of row data buffering in a register array according to this disclosure.
Figure 3B:
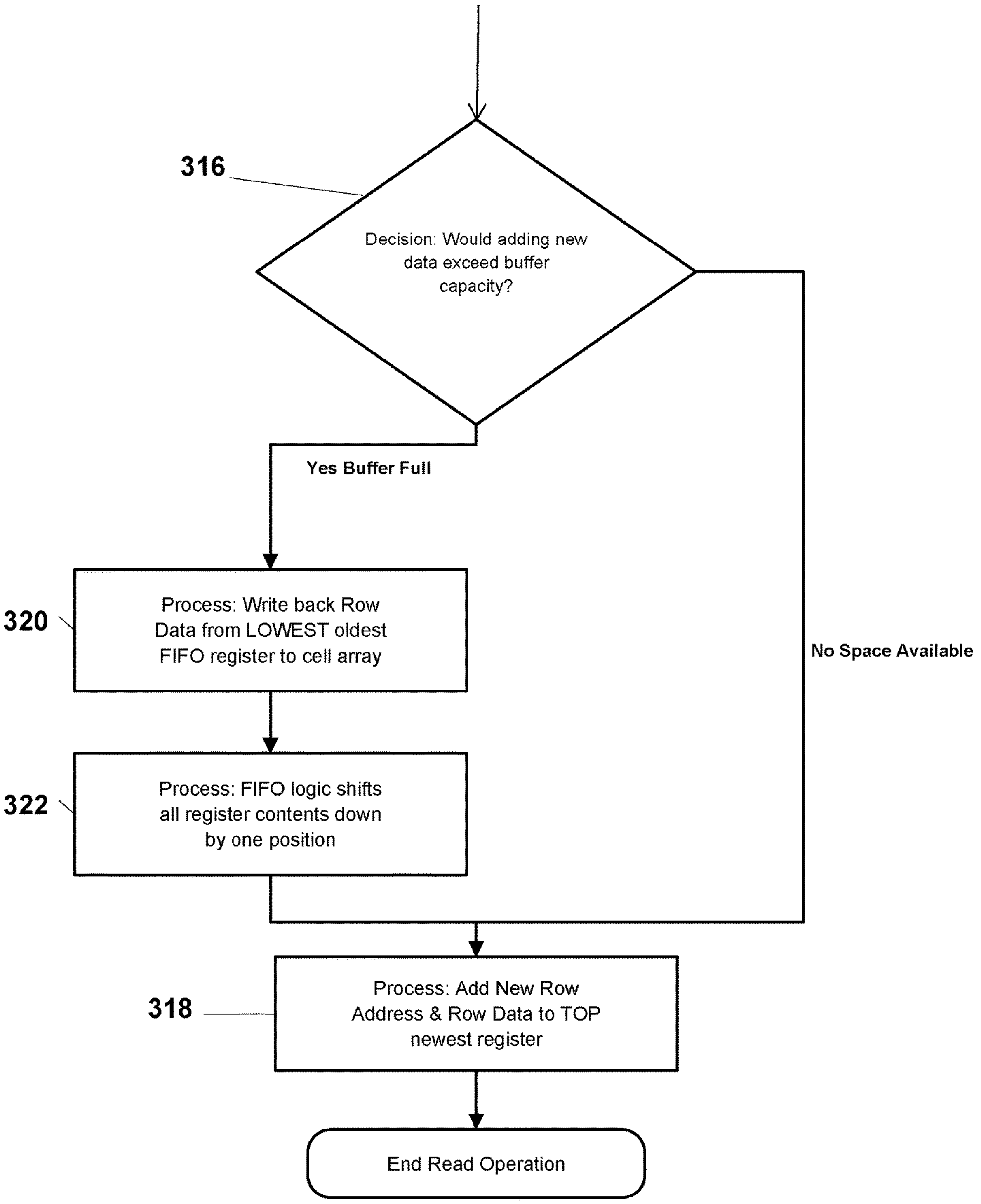
FIG. 3B is a continuation of the flow chart of FIG. 3A.

FIGS. 3A-3B illustrate a flow chart of a method 300 for mitigating row hammer effects in a memory device having a cell array comprising a plurality of rows for storing data and sense amplifiers configured to read data from a selected row of the cell array. The method begins with receiving a current row address 302. A CAM compares at step 304 current row address with buffered row address in data register 106 to determine at step 306 whether the current row address is buffered in data register 106. If yes, the method continues to step 308 to read the corresponding row data from data register 106. If no, the method continues to step 310 to activate the selected row from cell array 104 then to read the row data from cell array 104 at step 312. Although the comparison of the row address to those stored in the buffer at step 396 is shown as occurring before the activation of the row select signal in step 310, the steps can be done simultaneously since if the data is already in the row buffer, the data from the storage array will be discarded. The row address and row data is held at step 314 to consider at step 316 whether adding new data to data register 106 would exceed the buffer capacity. If space is available in data register 106, the method continues to step 318 where the data is added to data register 106. If, however, data register 106 is full, the method at step 320 writes back row data from the oldest row in data register 106 back to cell array 104, shifts all rows down in data register 106 at step 322 and before branching back to step 318 where the data is added to data register 106.

In summary, the disclosed memory device 100 and method mitigate the Row Hammer Effect by employing a multi-entry row data buffer structure that integrates content addressable memory (CAM) for efficient row address matching and first-in-first-out (FIFO) logic for managing buffered data, thereby delaying writeback operations to cell array 102 until the buffer reaches capacity. This approach introduces temporal spacing between row activations, preventing accelerated charge leakage and bit flips in adjacent rows without the performance overhead, increased power consumption, or additional hardware complexity associated with conventional techniques such as targeted row refresh or probabilistic activation counting.

Various arrangements and configurations of the components can be implemented without departing from the scope of the invention, such as differing buffer depths, integration with alternative memory controllers, or adaptations for specific memory architectures. Such architectures may include various types of semiconductor memory devices susceptible to disturbances like the Row Hammer Effect, including but not limited to dynamic random access memory (DRAM), synchronous DRAM (SDRAM), double data rate (DDR) SDRAM variants (e.g., DDR4, DDR5), low-power DRAM (LPDDR), graphics DDR (GDDR), or other volatile memory devices where data is stored in rows of capacitive cells that require periodic refresh and are vulnerable to charge leakage from repeated row activations.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are within the scope of the present invention, which is not to be limited except by the following claims.

What is claimed is:

1. A memory device comprising:

a cell array comprising a plurality of rows for storing data;

sense amplifiers configured to read data from a selected row of the cell array;

a row data buffer structure operatively coupled to the sense amplifiers and the cell array, the row data buffer structure comprising:

a plurality of registers, each register configured to store a row address and corresponding row data read from the cell array;

content addressable memory (CAM) configured to compare a current row address with row addresses stored in the plurality of registers to determine if the corresponding row data is buffered; and first-in-first-out (FIFO) logic configured to shift contents of the registers and manage storage of new row addresses and row data;

wherein the row data buffer structure is configured to buffer row data from multiple row read operations and to delay writeback of buffered row data to the cell array by writing back data from an oldest register only when adding new row data would exceed capacity of the row data buffer structure, thereby mitigating row hammer effects through temporal spacing of row activations.

2. The memory device of claim 1, wherein the FIFO logic is configured to:

store a new row address and corresponding row data in an available register of the plurality of registers when the row data buffer structure is not full; and shift contents of the registers toward an output register after writing back data from the output register to the cell array when adding new row data would exceed the capacity, wherein the output register holds the oldest buffered row data.

3. The memory device of claim 2, wherein the row data buffer structure is further configured to:

upon determining a match via the CAM for the current row address during a read or write operation, access or modify the corresponding row data in the matched register without shifting the contents of the registers and without writing back the modified row data to the cell array until the row data reaches the oldest register.

4. The memory device of claim 3, wherein, upon writing back data from the oldest register to the cell array, the row data buffer structure is further configured to:

route the row address stored in the oldest register to a row address decoder of the cell array to select the corresponding row; and activate row storage drivers to write the row data from the oldest register back to the selected row in the cell array before shifting the contents of the registers.

5. The memory device of claim 4, wherein a number of the plurality of registers in the row data buffer structure is determined based on an analysis of characteristics of the cell array to achieve a desired delay between writebacks to a same row in the cell array.

6. The memory device of claim 5, wherein the row data buffer structure further comprises:

inputs configured to receive row data from the sense amplifiers, the current row address for comparison by the CAM, and modified row data from input/output (I/O) logic; and wherein, during a write operation to a buffered row, the modified row data from the I/O logic is written back to the matched register in the row data buffer structure without immediate writeback to the cell array.

7. The memory device of claim 6, wherein the row data buffer structure further comprises: outputs configured to provide read data from a matched register to output drivers coupled to memory interface circuits, and to provide row write data and the corresponding row address from the oldest register to row storage drivers and a row address decoder of the cell array during writeback.

8. The memory device of claim 1, wherein the row data buffer structure is initialized in an empty state with no row addresses or row data stored in the plurality of registers, and wherein, upon an initial row read operation where the current row address does not match any stored row addresses via the CAM, the current row address and corresponding row data from the sense amplifiers are stored in a oldest register of the plurality of registers.

9. The memory device of claim 1, wherein the row data buffer structure is configured to:

provide buffered row data from a matched register to column select logic for read operations via memory interface circuits; and receive updated row data from the column select logic for write operations, wherein the updated row data is stored back in the matched register without immediate writeback to the cell array.

10. A method for mitigating row hammer effects in a memory device having a cell array comprising a plurality of rows for storing data and sense amplifiers configured to read data from a selected row of the cell array, the method comprising:

providing a row data buffer structure operatively coupled to the sense amplifiers and the cell array, the row data buffer structure comprising a plurality of registers, each register configured to store a row address and corresponding row data read from the cell array, content addressable memory (CAM) configured to compare a current row address with row addresses stored in the plurality of registers to determine if the corresponding row data is buffered, and first-in-first-out (FIFO) logic configured to shift contents of the registers and manage storage of new row addresses and row data;

buffering, using the row data buffer structure, row data from multiple row read operations; and delaying writeback of buffered row data to the cell array by writing back data from an oldest register only when adding new row data would exceed capacity of the row data buffer structure, thereby mitigating row hammer effects through temporal spacing of row activations.

11. The method of claim 10, wherein the FIFO logic performs:

storing a new row address and corresponding row data in an oldest empty register of the plurality of registers when the row data buffer structure is not full; and shifting contents of the registers downward toward the oldest register after writing back data from the oldest register to the cell array when adding new row data would exceed the capacity.

12. The method of claim 11, further comprising: upon determining a match via the CAM for the current row address during a read or write operation, accessing or modifying the corresponding row data in the matched register without shifting the contents of the registers and without writing back the modified row data to the cell array until the row data reaches the oldest register.

13. The method of claim 12, wherein, upon writing back data from the oldest register to the cell array, the method further comprises:

routing the row address stored in the oldest register to a row address decoder of the cell array to select the corresponding row; and activating row storage drivers to write the row data from the oldest register back to the selected row in the cell array before shifting the contents of the registers.

14. The method of claim 13, wherein a number of the plurality of registers in the row data buffer structure is determined based on an analysis of characteristics of the cell array to achieve a desired delay between writebacks to a same row in the cell array.

15. The method of claim 14, further comprising:

receiving, at inputs of the row data buffer structure, row data from the sense amplifiers, the current row address for comparison by the CAM, and modified row data from input/output (I/O) logic; and during a write operation to a buffered row, writing back the modified row data from the I/O logic to the matched register in the row data buffer structure without immediate writeback to the cell array.

16. The method of claim 15, further comprising:

providing, from outputs of the row data buffer structure, read data from a matched register to output drivers coupled to memory interface circuits, and providing row write data and the corresponding row address from the oldest register to row storage drivers and a row address decoder of the cell array during writeback.

17. The method of claim 10, further comprising:

initializing the row data buffer structure in an empty state with no row addresses or row data stored in the plurality of registers; and upon an initial row read operation where the current row address does not match any stored row addresses via the CAM, storing the current row address and corresponding row data from the sense amplifiers in an oldest register of the plurality of registers.

18. The method of claim 10, further comprising:

providing buffered row data from a matched register to column select logic for read operations via memory interface circuits; and receiving updated row data from the column select logic for write operations, wherein the updated row data is stored back in the matched register without immediate writeback to the cell array.

19. The method of claim 10, further comprising, during a row read operation comparing the current row address with row addresses stored in the plurality of registers using the CAM; upon determining no match via the CAM, storing the row data in the row data buffer structure as active row data; and upon determining a match via the CAM, ignoring the row data in the cell array and using the row data from the matched register as the active row data without modifying contents of the row data buffer structure.

* * * * *